United States Patent [19]

Bergman

[11] Patent Number: 4,783,763
[45] Date of Patent: Nov. 8, 1988

[54] FIELD-PROGRAMMABLE DEVICE WITH BUFFER BETWEEN PROGRAMMABLE CIRCUIT

[75] Inventor: Michael J. Bergman, San Jose, Calif.

[73] Assignee: North American Philips Corp., Signetics Division, Sunnyvale, Calif.

[21] Appl. No.: 812,688

[22] Filed: Dec. 23, 1985

[51] Int. Cl.$^4$ .................. G11C 7/00; G11C 17/00
[52] U.S. Cl. ........................... 365/94; 365/96; 365/104; 365/226
[58] Field of Search ............... 365/104, 226, 189, 94, 365/96, 104; 364/716, 736; 307/465

[56] References Cited

U.S. PATENT DOCUMENTS

| 4,488,226 | 12/1984 | Brice | 364/716 |
| 4,488,229 | 12/1984 | Harrison | 364/200 |
| 4,488,230 | 12/1984 | Harrison | 364/200 |

OTHER PUBLICATIONS

IBM Technical Disclosure Bulletin, vol. 24, No. 11A, Apr. 1982, by Wu, "Bit Addressing for Personalization of a Fused Link PLA".

Signetics Corp., Integrated Fuse Logic Data Manual, 1/1983.

Primary Examiner—Stuart N. Hecker
Assistant Examiner—Alyssa Bowler
Attorney, Agent, or Firm—R. Meetin; T. Briody; D. Treacy

[57] ABSTRACT

A field-programmable device contains a buffer (20) located between a pair of programmable circuits (14 and 16) along a column (10) connecting the circuits. The buffer provides increased current to the column portion connected to one of the circuits (16) without increasing the current supply requirements for the column portion connected to the other circuit (14). This permits the device to switch faster and/or to accommodate programmable circuits of large size. The buffer also enables the same select circuitry to be used in programming both circuits without causing a significant voltage between them during normal operation.

17 Claims, 4 Drawing Sheets

FIELD-PROGRAMMABLE DEVICE WITH BUFFER BETWEEN PROGRAMMABLE CIRCUIT

FIELD OF USE

This invention relates to field-programmable devices manufacturable as integrated circuits.

BACKGROUND ART

Field-programmable devices are popular in the electronics industry because they provide the user with great flexibility in tailoring a general integrated circuit to meet specific applications at low cost. The most common type of programmable element used in a field-programmable integrated circuit such as a field-programmable logic device ("PLD") is a fusible link or fuse. Programming involves destroying (or "blowing") a specific pattern of fuses to create an open circuit at each location where a connection is not wanted. A closed circuit exists at each location where a fuse remains intact to provide an electrical connection. Another type of programmable element is the so-called "antifuse". In contrast to a fuse, an antifuse is initially an open circuit and is programmed to create a closed circuit.

FIG. 1 illustrates a segment of a two-level PLD, such as the PLS100 integrated circuit made by Signetics Corp., in which an array of programmable AND gates drives an array of programmable OR gates. The AND array operates on M array input signals $V_{I1}-V_{IM}$ supplied on M array input lines $L_{I1}-L_{IM}$. The OR array consists of N OR gates that respectively provide N array output signals on N array output lines $L_{O1}-L_{ON}$.

The two programmable arrays are arranged in a number of columns. The circuitry centering about a typical column 10 is shown in FIG. 1. Column 10 consists of lines $L_U$ and $L_L$ coupled together through a low-value resistor $R_C$. Gate X of the AND array is connected to line $L_U$. Portions of all N OR gates are connected to line $L_L$. These portions are collectively referred to as circuit Y. A current supply consisting of a resistor $R_{S1}$ connected to a source of a high supply voltage $V_{CC}$ provides line $L_U$ with current for normal operation. This current is insufficient to cause any of the programmable elements along column 10 to be programmed.

AND gate X has M input sections that respectively receive voltages $V_{I1}-V_{IM}$. Letting j be a running integer, each input section consists of a fuse $F_{Xj}$ connected in series with a Schottky diode $D_{Xj}$ between lines $L_{Ij}$ and $L_U$. The output signal from gate X is supplied as a column signal on line $L_U$ through resistor $R_C$ to line $L_L$.

The column signal is an input signal to all N OR gates. In particular, one of the input sections of each OR gate receives the column signal. Letting k be a running integer, each OR input section shown in FIG. 1 consists of a fuse $F_{Yk}$ connected in series with the base-emitter junction of an NPN transistor $Q_{Yk}$ between lines $L_L$ and $L_{Ok}$. The $Q_{Yk}$ collectors are coupled through a diode $D_C$ to the $V_{CC}$ supply. The other input sections of the OR gates are connected to the other columns in the same way.

The foregoing components are utilized during normal PLD switching. The $R_{S1}$ supply provides column current for gate X and charges the column capacitance—i.e., parasitic capacitance portions $C_{PU}$ and $C_{PL}$ respectively associated with lines $L_U$ and $L_L$. The $R_{S1}$ supply also provides drive current for circuit Y.

Additional circuitry is needed to program the AND and OR circuit elements. The main item of programming circuitry is a column select circuit 12 which selects one of the columns in response to select signals $V_S$. Column select 12 is connected between line $L_U$ and a source of a programming voltage $V_{PP}$. The $Q_{Yk}$ collectors are also connected to the $V_{PP}$ supply via a diode string $D_{PP}$.

In programming the circuitry of FIG. 1, line $L_{Ij}$ or $L_{Ok}$ of a fuse $F_{Ij}$ or $F_{Ok}$ to be destroyed is set at a low voltage. The remainder of lines $L_{I1}-L_{IM}$ and $L_{O1}-L_{ON}$ are allowed to float. Column 10 is then selected. During a programming period, voltage $V_{PP}$ is raised from circuit ground to a value considerably higher than $V_{CC}$. Circuit 12 then provides line $L_U$ with current at a very high voltage. If line $L_{Ij}$ is the line set at a low voltage, diode $D_{Xj}$ turns on very hard and draws sufficient current to blow fuse $F_{Xj}$. If line $L_{Ok}$ is low, transistor $Q_{Yk}$ similarly turns on hard. It draws enough current through diode string $D_{PP}$ to blow fuse $F_{Yk}$.

An advantage of the PLD of FIG. 1 is that circuit 12 is utilized in selecting columns to program both the AND array and the OR array. It is not necessary to have separate select circuits for the two arrays. This keeps the component count down. Another advantage is that very little voltage drop occurs between the arrays during normal switching (or AC) operation, thereby allowing voltages $V_{O1}-V_{ON}$ to attain relatively high levels.

The necessity to charge the column capacitance with current from the $R_{S1}$ supply does, however, limit the switching speed. Future applications entailing more gates will require more current to drive the extra gates and to charge the attendant additional column capacitance. Faster switching speed will often be needed. Due to power limitations on the circuitry that drives signals $V_{I1}-V_{IM}$, providing the additional current from the $R_{S1}$ supply is inefficient. It would be desirable to have a technique for increasing the $L_L$ current to achieve faster switching and/or to accommodate more gates without necessarily increasing the $L_U$ current and without sacrificing the aforementioned advantages.

GENERAL DISCLOSURE OF THE INVENTION

In accordance with the invention, a field-programmable device has a buffer located between a pair of programmable circuits along a column connecting the circuits. The buffer provides increased current to the portion of the column connected to one of the circuits without increasing the current supply requirements for the portion of the column connected to the other circuit. This allows the device to switch faster and/or to accommodate larger programmable circuits. The buffer is configured in such a manner as to enable the same select circuitry to be used for programming both circuits while limiting the voltage drop between the circuits to a low value during normal operation.

More particularly, the programmable circuits are designated as the first and second circuits. Each has at least one non-volatile field-programmable element. The column is formed with first and second lines respectively connected to the first and second circuits. A first current supply provides the first line with current adequate for normal operation of the device but insufficient to enable any of the field-programmable elements to be programmed. A select circuit provides the first line with current that reaches a level sufficient to enable each field-programable element in the first circuit to be programmed during a programming period.

The buffer couples the lines. It contains a second current supply for providing current at a node for normal operation of the device. A pair of rectifiers are arranged in parallel in opposite forward conductive directions between the first line and the node.

The buffer includes an amplifier having a first flow electrode, a second flow electrode, and a control electrode for controlling current transmission between the flow electrodes. When the amplifier is forwardly conductive, positive current flows unidirectionally from one of the flow electrodes to the other. The control electrode is coupled to the node. The second electrode is coupled to the second line. A supply circuit provides the first electrode with current which is normally insufficient to enable any of the field-programmable elements to be programmed but which, in conjunction with the current from the select circuit, reaches a level sufficient to enable each field-programmable element in the second circuit to be programmed during a programming period.

The buffer operates generally in the following manner. During normal switching, the combination of the amplifier, the second current supply, the supply circuit, and one of the rectifiers provides the second line with more current than that flowing through the first line. This enables the device to switch faster. The select circuit is utilized in the conventional way to program the first circuit. During programming, the other rectifier opens a voltage/current path to the amplifier. This path enables the select circuit to be used in programming the second circuit.

BRIEF DESCRIPTION OF THE DRAWINGS

Like reference symbols are used in the drawings and in the description of the preferred embodiments to represent the same or very similar item or items.

DESCRIPTION OF THE PREFERRED EMBODIMENTS

Figure 2:
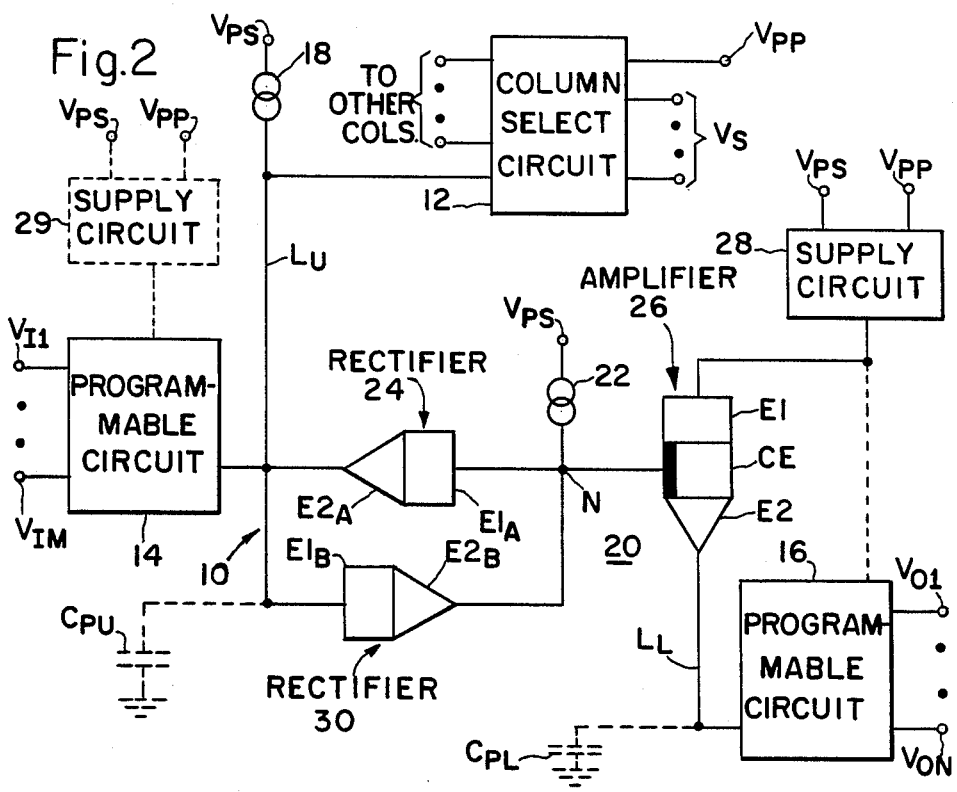
FIG. 2 is a block diagram of a field-programmable device according to the invention.

Referring to the drawings, FIG. 2 illustrates a field-programmable device in which a pair of programmable circuits 14 and 16 are respectively connected to lines $L_U$ and $L_L$ of column 10. Each circuit 14 or 16 contains at least one non-volatile field-programmable element such as a fuse or an antifuse. A current supply 18 connected to a source of a power-supply voltage $V_{PS}$ provides line $L_U$ with current suitable for normal operation of the device but insufficient to enable any of the programmable elements to be programmed. A column buffer 20 couples line $L_U$ to line $L_L$. The device is usually part of a larger field-programmable device containing one or more other columns (not shown) akin to column 10.

Circuit 14 provides a column signal on line $L_U$ in response to input voltages $V_{I1}$-$V_{IM}$. Circuit 16 provides output voltages $V_{O1}$-$V_{ON}$ in response to the column signal on line $L_L$. The column signals for other column lines (not shown) akin to line $L_L$ may affect signals $V_{O1}$-$V_{ON}$. Circuits 14 and 16 are typically configured to perform logic operations.

During normal switching operation, buffer 20 provides line $L_L$ with more current than line $L_U$ draws from supply 18. This action is performed with a current supply 22, a rectifier 24, an amplifier 26, and a supply circuit 28.

Supply 22 provides a node N with current from the $V_{PS}$ supply. Rectifier 24 has flow electrodes $E1_A$ and $E2_A$ respectively connected to node N and line $L_U$. If the direction of positive current flow—i.e., the forward conductive direction—through rectifier 24 is from electrode $E1_A$ to electrode $E2_A$, rectifier 24 becomes forwardly conductive when the $E1_A$-to-$E2_A$ voltage reaches a suitable positive threshhold value.

Amplifier 26 has a first flow electrode E1, a second flow electrode E2, and a control electrode CE for controlling current transmission between electrodes E1 and E2. Electrode CE is connected to node N. Supply circuit 28 provides electrode E1 with current from either the $V_{PS}$ supply or the $V_{PP}$ supply. Electrode E2 is connected to line $L_L$.

When amplifier 26 is forwardly conductive, positive current flows unidirectionally from one of electrodes E1 and E2 to the other. This is typically, though not necessarily, achieved by configuring amplifier 26 in such a way that charge carriers moving between electrodes E1 and E2 consist substantially of either electrons or holes that originate at electrode E2 and terminate at electrode E1. If positive current flows from electrode E1 to electrode E2, amplifier 26 becomes forwardly conductive when the CE-to-E2 voltage reaches a suitable positive threshold value. The forward current-flow directions in elements 24 and 26 are related in such a manner that positive current then flows from electrode $E1_A$ to electrode $E2_A$. (although not necessarily at the same time). $V_{PS}$ is also positive relative to circuit ground. If positive current flows from electrode E2 to electrode E1, the various polarities for rectifier 24, amplifier 26, and the $V_{PS}$ supply are opposite to those given above.

Supply circuit 28 may provide some current directly to circuit 16 depending on its internal makeup. Largely the same applies to circuit 14. Depending on its internal makeup, it may receive some additional current from another such supply circuit 29 tied to the $V_{PS}$ and $V_{PP}$ supplies.

In the normal AC mode, the device operates as follows. For simplicity, assume that positive current flows from electrode E1 to electrode E2. Likewise, assume that $V_{PS}$ is positive relative to circuit ground.

Let the $L_U$ voltage be sufficiently low that rectifier 24 is turned on to pull the voltage at node N to a low value. Current from supply 22 flows through components 24 and 14 to the device input where signals $V_{I1}$-$V_{IM}$ are supplied. Amplifier 26 is either turned off or turned on but conducting a small current. The $L_L$ voltage is low.

Voltages $V_{I1}$-$V_{IM}$ are now adjusted in the manner that forces the $L_U$ voltage to a high value. Supplies 18 and 22 start to charge line capacitance $C_{PU}$. This allows the voltage at node N to rise, causing amplifier 26 to provide line $L_L$ with a large current from circuit 28. Line capacitance $C_{PL}$ charges rapidly to raise the $L_L$ voltage to a high level. Supply 22 may provide some current to electrode CE depending on the characteristics of amplifier 26. The opposite occurs when voltages $V_{I1}$-$V_{IM}$ are readjusted to bring the the $L_U$ voltage back down.

Importantly, the column voltage drop—i.e., the difference between the $L_U$ and $L_L$ voltages—is approximately the difference between the threshold voltages of components 24 and 26 during normal operation. This difference can be set at a very low value by suitably choosing the elements that constitute components 24 and 26.

Column select 12 is utilized in programming both circuit 14 and circuit 16. If there is at least one other column besides column 10, circuit 12 selects one of the columns in response to signals $V_S$. If column 10 is to be selected, voltages $V_{I1}$-$V_{IM}$ and $V_{O1}$-$V_{ON}$ are first adjusted to suitable values.

Upon selecting column 10, circuit 12 provides line $L_U$ with current from the $V_{PP}$ supply at a voltage/current level sufficient to enable each programmable element in circuit 14 to be programmed. If circuit 29 is present, it also provides programming current to circuit 14. Whether any programming actually occurs in circuit 14 depends, of course, on the values of voltages $V_{I1}$-$V_{IM}$. During programming, voltage $V_{PP}$ is raised to a positive level considerably above $V_{PS}$ if positive current flows from electrode E1 to electrode E2.

For programming circuit 16, buffer 20 contains a rectifier 30 connected between line $L_U$ and node N in the opposite forward conductive direction to that of rectifier 24. Rectifier 30 has electrodes E1$_B$ and E2$_B$ connected as shown in FIG. 2. Rectifier 30 is reverse biased during AC operation.

Circuit 16 is programmed in the following manner. Again assume that the positive current flows from electrode E1 to electrode E2. Signals $V_{O1}$-$V_{ON}$ are first adjusted to suitable values. After selecting column 10, circuit 12 provides line $L_U$ with current at a sufficiently high voltage to cause rectifier 30 to become forwardly conductive. Node N rises to a voltage near $V_{PP}$. If not already on, amplifier 26 turns on. Any drive current that electrode CE may need is supplied from circuit 12 via a path through rectifier 30. Circuit 28 provides programming current through amplifier 26 to line $L_U$. Depending on the makeup of circuit 16, this current may either program circuit 16 directly or with the assistance of other programming current provided directly from circuit 28.

If positive current flows from electrode E2 to electrode E1, the polarities that arise during AC operation and programming are reversed from those described above. However, the events are otherwise the same.

Figure 3:
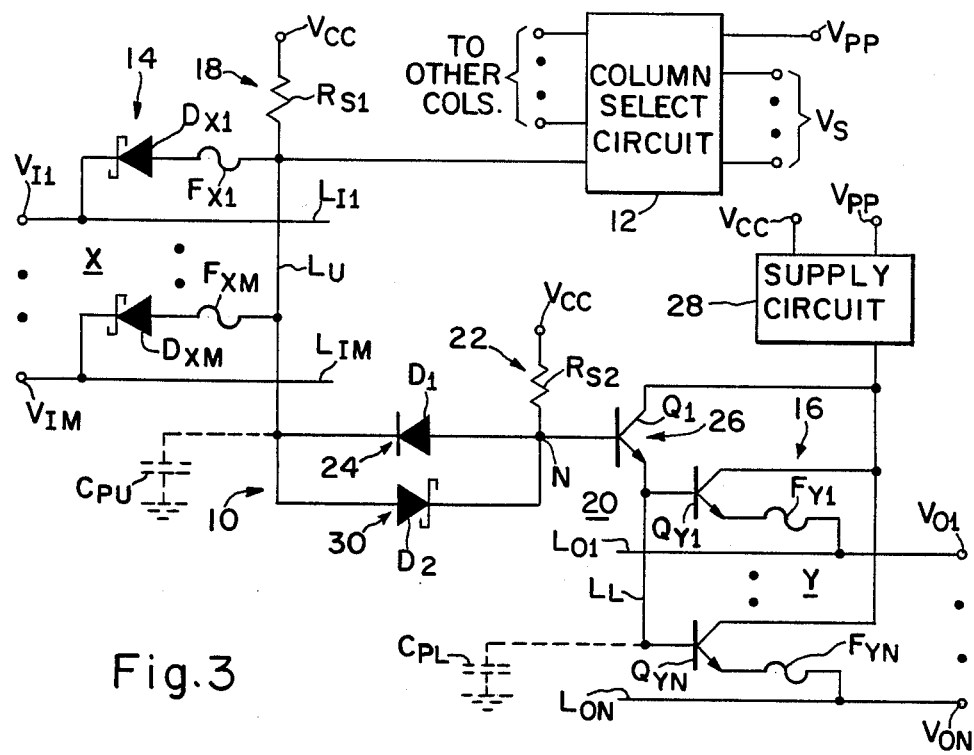
FIGS. 3–7 are partial circuit diagrams of specific embodiments of PLD's using the basic architecture of FIG. 2.

FIG. 3 shows an embodiment of FIG. 2 in which the device is part of a PLD. In FIG. 3, circuits 14 and 16 respectively are AND gate X and OR circuit Y arranged as in FIG. 1. Supply 18 consists of resistor $R_{S1}$. Voltage $V_{PS}$ is positive voltage $V_{CC}$. Components 22, 24, 26, and 30 respectively are a resistor $R_{S2}$, a PN diode $D_1$, an NPN transistor $Q_1$, and a Schottky diode $D_2$. As a result, the column voltage drop is close to 0 volt. The $R_{S1}$ and $R_{S2}$ sources typically supply approximately the same current as the $R_{S1}$ source in FIG. 1.

Figure 1:
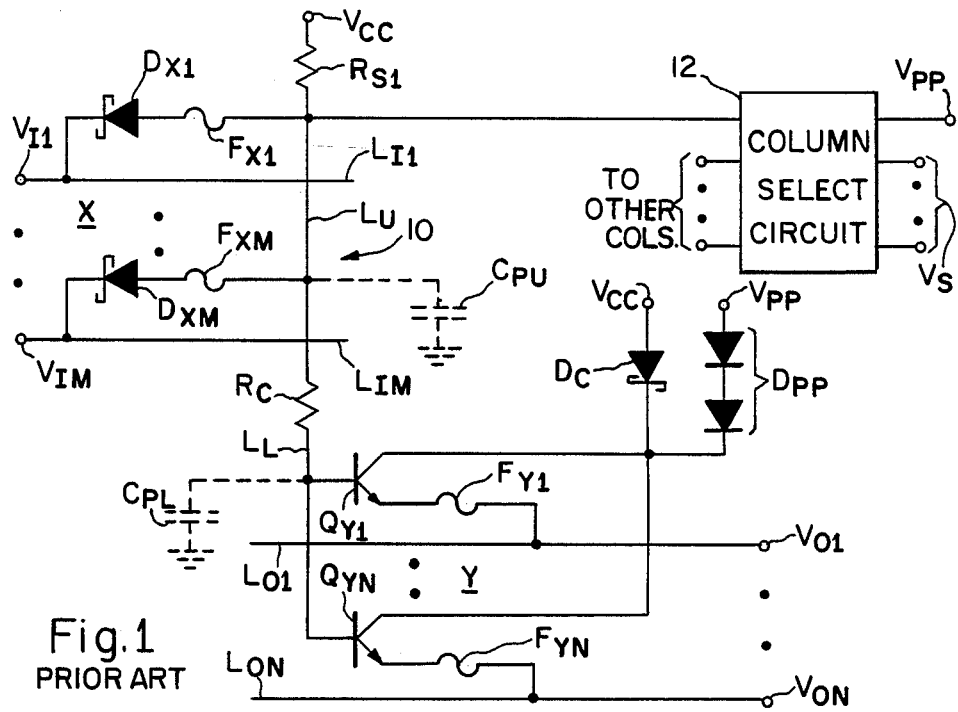
FIG. 1 is a partial circuit diagram of a prior art PLD.

Insofar as programming is concerned, signals $V_{I1}$-$V_{IM}$ and $V_{O1}$-$V_{ON}$ are manipulated the same as in the PLD of FIG. 1. Base drive current for transistor $Q_1$ is applied from circuit 12 by way of diode $D_2$. In turn, transistor $Q_1$ supplies the base drive current for transistor $Q_{Yk}$ of each fuse $F_{Yk}$ to be destroyed. Nearly all of the current that actually blows fuse $F_{Yk}$ is supplied directly from circuit 28 to the $Q_{Yk}$ collector.

Figure 4:
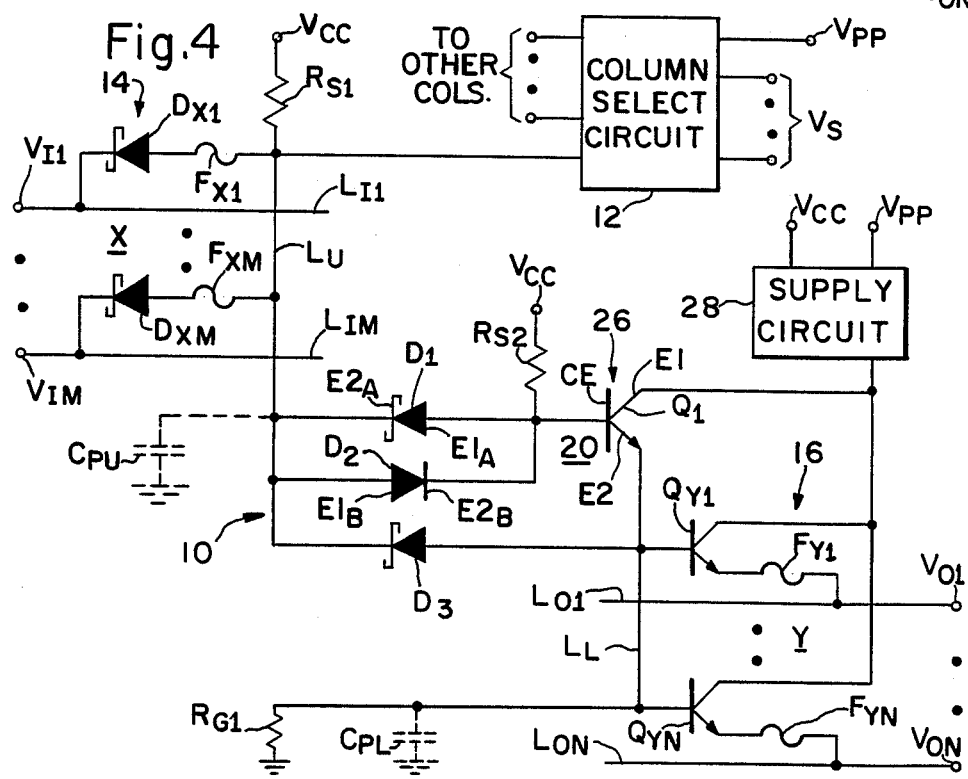

FIG. 4 depicts a variation of FIG. 3 in which diode $D_1$ is a Schottky diode, while diode $D_2$ is a PN diode.

The column voltage drop is now several tenths of a volt higher than in FIG. 3. A Schottky diode $D_3$ is connected between lines $L_U$ and $L_L$ in the forward conductive direction of the $Q_1$ base-emitter junction to provide a path for discharging capacitance $C_{PL}$. A resistor $R_{G1}$ connected between line $L_L$ and ground serves to stabilize the $L_L$ voltage at the end of a transition and helps in discharging capacitance $C_{PL}$. The combination of components 20, $D_3$, and $R_{G1}$ thus allows voltages $V_{O1}$-$V_{ON}$ to make rapid transitions in both directions.

Figure 5:
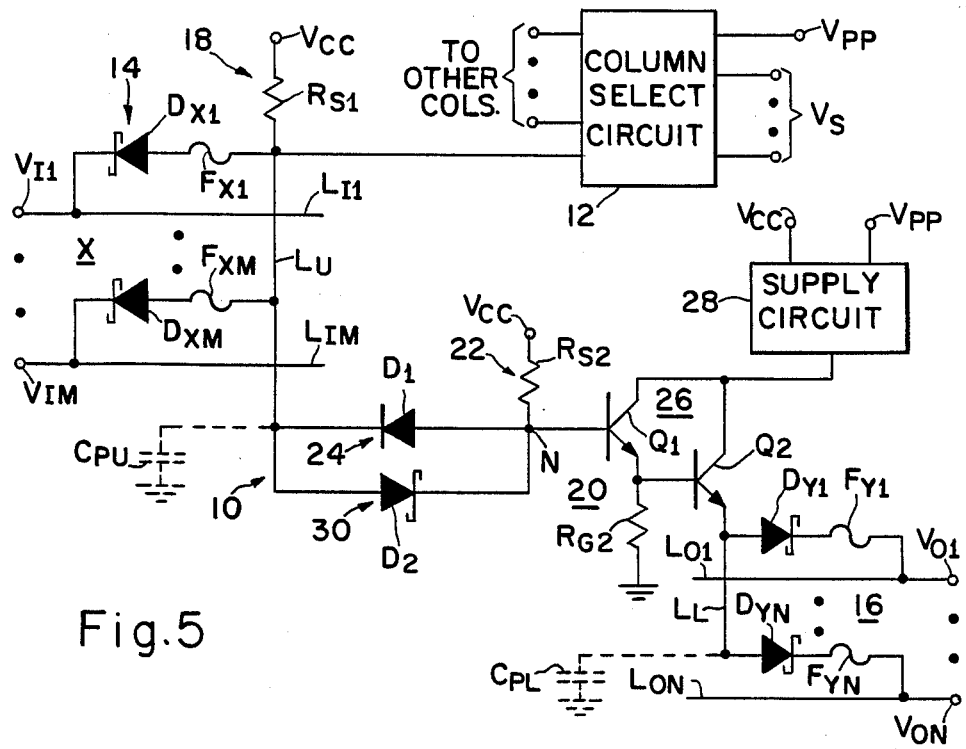

FIG. 5 shows another embodiment of FIG. 2 in which the device is part of a PLD. Components 14, 18, 22, 24, and 30 are the same as in FIG. 3. However, circuit 16 in FIG. 5 is part of a programmable diode OR array rather than being part of a transistor OR array. A Schottky diode $D_{Yk}$ replaces each $Q_{Yk}$ base-emitter junction.

Because the diode array does not have the current gain of the transistor array, amplifier 26 consists of NPN transistors $Q_1$ and $Q_2$ arranged in a Darlington configuration to provide the necessary current gain. Transistor $Q_1$ normally stays on during AC operation. Depending on temperature, transistor $Q_2$ may turn off when the $L_L$ voltage goes low to cut off the current flow to the $D_{Yk}$ diodes. A resistor $R_{G2}$ provides a path to ground for discharging the $Q_2$ base.

In programming the PLD of FIG. 5, voltages $V_{I1}$-$V_{IM}$ and $V_{O1}$-$V_{ON}$ are handled the same way as in FIG. 1. Diode $D_2$ provides the base drive for transistor $Q_1$ which supplies the base drive for transistor $Q_2$. The fusing current for each fuse $F_{Yk}$ to be blown is provided through transistor $Q_2$ in amplifier 26.

Figure 6:
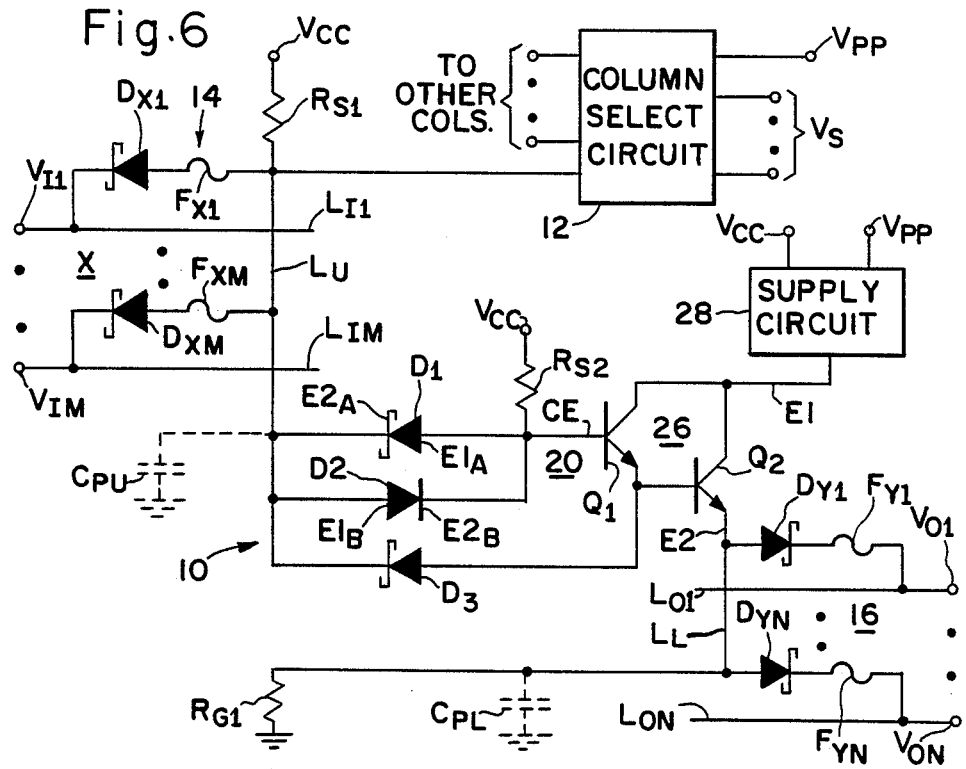

FIG. 6 depicts a variation of FIG. 5 in which diode $D_1$ is a Schottky diode and diode $D_2$ is a PN diode. Diode $D_3$ provides a path for discharging the $Q_2$ base. Resistor $R_{G1}$ is utilized for the previously mentioned reasons. The combination of components 20, $D_3$, and $R_{G1}$ yields a high switching speed.

Figure 7:
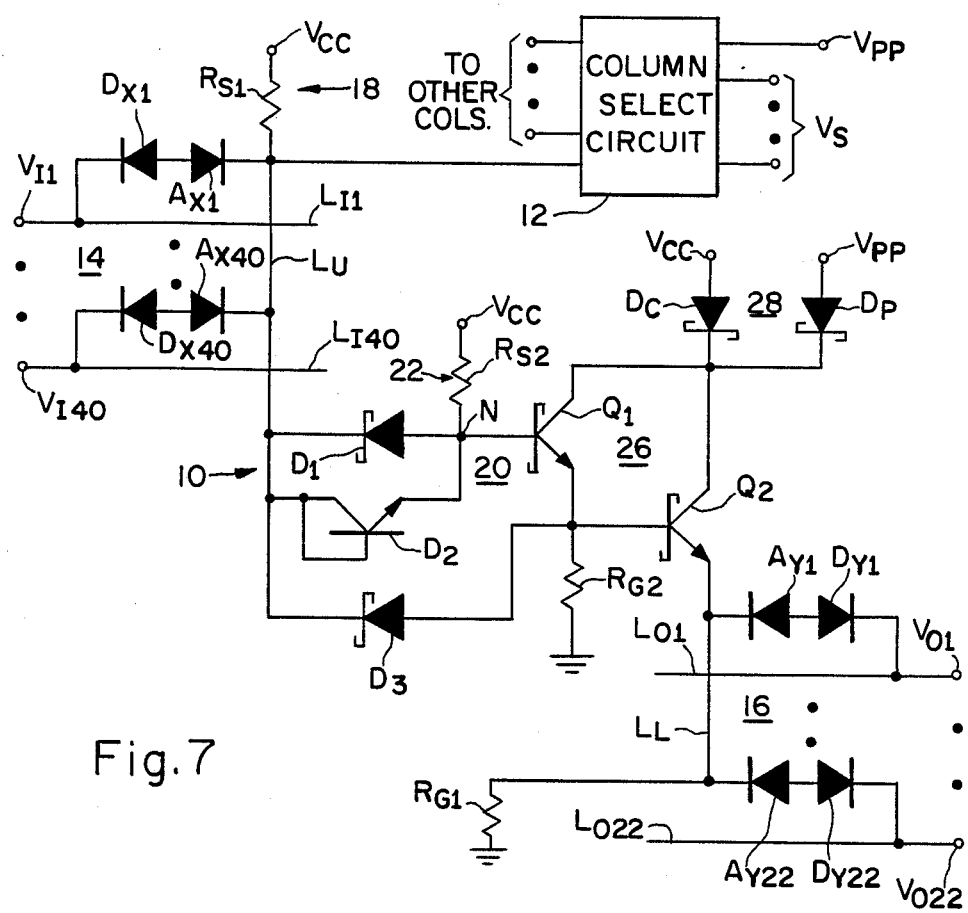

FIG. 7 illustrates a preferred embodiment of FIG. 2 in which the device is part of a PLD. Components $D_1$, $D_2$, $D_3$, $R_{S1}$, $R_{S2}$, $R_{G1}$ and 26 are the same as in FIG. 6, except that each transistor $Q_1$ or $Q_2$ of amplifier 26 is Schottky clamped. Elements $D_3$ and $R_{G2}$ help discharge the $Q_2$ base.

Circuit 14 is again an AND gate except that each fuse $F_{Xj}$ of FIG. 6 is replaced with an antifuse $A_{Xj}$ formed with a PN diode. Likewise, circuit 16 is again part of a programmable OR array except that each fuse $F_{Yk}$ of FIG. 6 is replaced with a PN-diode antifuse $A_{Yk}$. Also, each diode $D_{Xj}$ or $D_{Yk}$ is a PN diode rather than a Schottky diode.

Voltage $V_{CC}$ is preferably 5 volts in the PLD of FIG. 7. Voltage $V_{PP}$ goes to a maximum of about 20 volts during programming. The breakdown (or programming) voltage for the antifuses is about 5 volts. Resistors $R_{S1}$, $R_{S2}$, $R_{G1}$, and $R_{G2}$ respectively are 7,500, 9,000, 10,000 and 15,000 ohms.

Figure 8:
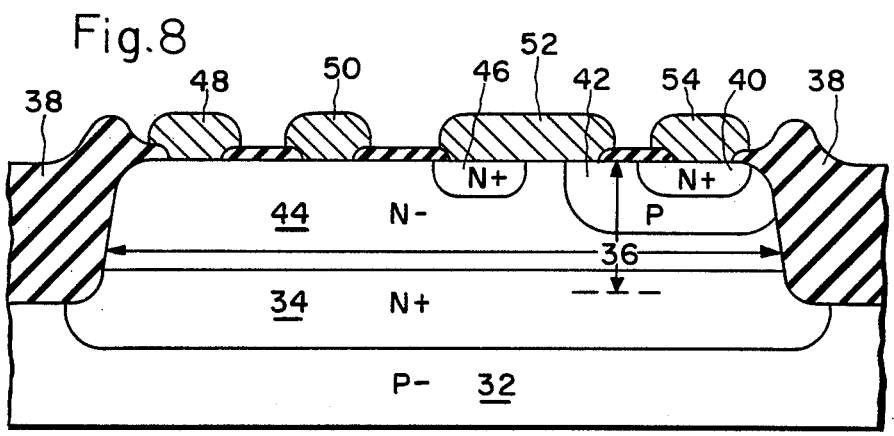
FIG. 8 is a cross-sectional view of a portion of the PLD of FIG. 7.

The various field-programable devices of the present invention are fabricated according to conventional integrated-circuit processing techniques. Oxide isolation is preferably used to separate active regions on a semiconductor wafer.

Where one of diodes $D_1$ and $D_2$ is a Schottky diode while the other is a PN diode consisting of an NPN transistor having its base shorted to its collector as (for example) indicated in FIG. 7, diodes $D_1$ and $D_2$ are preferably formed in the merged structure illustrated in FIG. 8. In this example, diode $D_1$ is the Schottky diode.

Regions 32, 34, 36, and 38 in this structure respectively are a P- silicon substrate, a buried N+ layer, an active semiconductive island formed in a silicon epaxial layer, and an annular region of silicon dioxide laterally separating the active island from other such active islands.

Region 40 is the $D_2$ emitter which consists of a highly doped N-type portion of island 36. Region 42 is the $D_2$ base consisting of a P-type portion of island 36 that separates emitter 40 from the remainder 44 of island 36. Remainder 44 is N-type material and includes a more highly doped portion 46 that serves as a contact zone. The combination of regions 34 and 44 (including portion 46) serves jointly as the $D_1$ cathode, the $D_2$ collector, and the $D_3$ cathode. Aluminum sections 48, 50, 52, and 54 respectively are the $D_3$ anode, the $D_1$ anode, line $L_U$, and a line going to node N.

While the invention has been described with reference to particular embodiments, this description is for illustrative purposes only and is not to be construed as limiting the scope of the invention claimed below. For example, bipolar transistors might be used in place of the $D_{Xj}$ diodes in circuit 14. In this case, supply circuit 29 would provide current to the collectors of these transistors for both normal operation and programming.

Amplifier 26 could utilize field-effect transistors (FET's) of either the insulated-gate or junction type. If amplifier 26 is constituted with a single FET, its drain, source, and gate, respectively are electrodes E1, E2, and CE. A diode-connected FET might be used for each rectifier. The field-programmable element might be the floating-gate electrodes of floating-gate FET's. Various changes, modifications, and applications may be thus made by those skilled in the art without departing from the true scope and spirit of the invention as defined by the appended claims.

I claim:

1. A field-programmble device in which there are: first and second circuits, each having at least one field-programmable element; first and second lines respectively connected to the first and second circuits; means for coupling the first and second lines; a first current supply for providing the first line with current adequate for normal operation of the device but insufficient to enable any of the field-programmable elements to be programmed; and select means for providing the first line with current that reaches a level sufficient tb enable each field-programmable element in the first circuit to be programmed during a programming period; characterized in that the coupling means comprises:
   a second current supply for providing current at a node;
   a first rectifier coupled between the first line and the node;
   a second rectifier coupled between the node and the first line in the opposite forward conductive direction to the first rectifier;
   an amplifier having a first flow electrode, a second flow electrode, and a control electrode for controlling current transmission between the flow electrodes, the control electrode coupled to the node, the second electrode coupled to the second line; and
   supply means for providing the first electrode with current which is normally insufficient to enable any of the field-programmable elements to be programmed but which, in conjunction with the current from the select means, reaches a level sufficient to enable each field-programmable element in the second circuit to be programmed during a programming period.

2. A device as in claim 1 characterized in that positive current flows unidirectionally from one of the flow electrodes to the other through the amplifier when it is forwardly conductive.

3. A device as in claim 2 characterized in that charge carriers moving between the flow electrodes originate at the second electrode and terminate at the first electrode.

4. A device as in claim 1 wherein: the first supply is coupled between the first line and a source of a power-supply voltage; and the select means is coupled between the first line and a source of a programming voltage; characterized in that:
   the second supply is coupled between the node and the source of the power-supply voltage; and
   the supply means is coupled to the first electrode and to the sources of the power-supply and programming voltages.

5. A device as in claim 4 characterized in that the supply means is coupled directly to the second circuit in common with the first electrode.

6. A device as in claim 5 characterized by further supply means coupled to the first circuit and to the sources of the power-supply and programming voltages.

7. A device as in claim 2 characterized in that the amplifier comprises a transistor having three electrodes, each coupled to a different one of the electrodes of the amplifier.

8. A device as in claim 7 characterized in that each rectifier comprises a diode.

9. A device as in claim 2 characterized in that the amplifier comprises a bipolar transistor having a collector, an emitter, and a base respectively coupled to the first, second, and control electrodes.

10. A device as in claim 9 characterized by a third rectifier coupled between the first and second lines in the forward conductive direction of the base-emitter junction of the transistor.

11. A device as in claim 10 characterized in that each field-programmable element in the second circuit is coupled between an output line and an emitter of a like-polarity bipolar transistor having a collector coupled to the supply means and a base coupled to the second line.

12. A device as in claim 2 characterized in that the amplifier comprises:
   a first bipolar transistor having a collector coupled to the first electrode, an emitter, and a base coupled to the control electrode; and
   a like-polarity second bipolar transistor having a collector coupled to the first electrode, an emitter coupled to the second electrode, and a base coupled to the emitter of the first transistor.

13. A device as in claim 12 characterized in that the amplifier includes means for discharging the base of the second transistor.

14. A device as in claim 12 characterized in that each programmable element in the second circuit is in series with a corresponding diode to form a combination coupled between an output line and the second line.

15. A device as in claim 14 characterized by a third rectifier coupled between the first line and the emitter of the first transistor in the forward conductive direction of its base-emitter junction.

16. A device as in claim 2 characterized in that:

the first rectifier comprises a Schottky diode having an anode coupled to the node and a cathode coupled to the first line; and the second rectifier comprises an NPN transistor having a collector coupled to the first line, a base connected to the collector, and an emitter coupled to the node.

17. A device as in claim 16, characterized in that the device comprises:

a semiconductor body in which an active semiconductor island has a N-type portion serving as the emitter, a P-type portion serving as the base and separating the emitter from the remainder of the island, and an N-type region adjoining the base, having a more highly doped contact portion, and serving jointly as at least part of the collector and as at least part of the cathode, the portions being located along an upper surface of the island;

a first metallic section in contact with the N-type region along the upper surface at a location spaced apart from the contact portion, the first metal section serving as the anode; and a second metallic section in contact with both the contact portion and the P-type portion along the upper surface at a location spaced apart from the first metallic section, the second metallic section forming at least part of the first line.

* * * * *